(12) United States Patent
Dinh

(10) Patent No.: US 6,628,533 B2
(45) Date of Patent: Sep. 30, 2003

(54) DC-TO-DC CONVERTER PROVIDING HIGH CURRENT AND LOW VOLTAGE

(75) Inventor: James S. Dinh, Gig Harbor, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/911,649

(22) Filed: Jul. 24, 2001

(65) Prior Publication Data

US 2002/0027788 A1 Mar. 7, 2002

Related U.S. Application Data

(63) Continuation of application No. 09/352,451, filed on Jul. 13, 1999, now abandoned, which is a continuation-in-part of application No. 09/083,901, filed on May 22, 1998, and a continuation-in-part of application No. 09/083,564, filed on May 22, 1998, now Pat. No. 6,212,086.

(51) Int. Cl.$^7$ ............................................... H02M 3/335
(52) U.S. Cl. ....................................................... 363/24
(58) Field of Search ............................. 363/16, 24, 25, 363/62, 84, 125, 126, 127, 132, 133

(56) References Cited

U.S. PATENT DOCUMENTS 4,399,499 A * 8/1983 Butcher et al. ................ 363/17
5,477,131 A * 12/1995 Gegner ........................ 323/222

* cited by examiner

Primary Examiner—Adolf D. Berhane
(74) Attorney, Agent, or Firm—Blakely, Sokoloff, Taylor & Zafman LLP

(57) ABSTRACT

Briefly, in accordance with one embodiment of the invention, a DC-to-DC converter includes: a synchronous rectifier converter. The synchronous rectifier converter includes a buck converter. The transformer of the synchronous rectifier converter employs less than five windings on the secondary.

3 Claims, 4 Drawing Sheets

DC-TO-DC CONVERTER PROVIDING HIGH CURRENT AND LOW VOLTAGE

RELATED APPLICATIONS

This is a Continuation Patent Application of U.S. patent application Ser. No. 09/352,451, filed Jul. 13, 1999, now abandoned titled, "DC-to-DC Converter Providing High Current and Low Voltage," by James S. Dinh, assigned to the assignee of the present invention and herein incorporated by reference.

This patent application is a Continuation-In-Part (CIP) of co-pending patent applications, U.S. patent application Ser. No. 09/083,901, titled "DC-TO-DC CONVERTER PROVIDING HIGH CURRENT AND LOW VOLTAGE," by J. Dinh, filed on May 22, 1998, and U.S. patent application Ser. No. 09/083,564, titled "PACKAGING OF A DC-TO-DC CONVERTER," by J. Dinh, filed on May 22, 1998, now U.S. Pat. No. 6,212,086 both of the foregoing patent applications being assigned to the assignee of the present invention and herein incorporated by reference.

BACKGROUND

1. Field

The present invention relates to voltage converters, and more particularly, to direct-current (DC) to direct-current (DC) converters.

2. Background Information

DC-to-DC converters are well-known in the art. Such circuitry or devices are typically employed to convert from one DC voltage signal level to another DC voltage signal level. This may be useful in a variety of environments. A number of such converters are well-known.

A number of challenges remain in this technology. One problem is providing a desired, highly regulated, voltage which may vary in a range, such as, for example, from 1.26 volts to 2.1 volts, and that may depend, at least in part, on clock speed. Another challenge is to provide this voltage at relatively high currents that may vary from several hundred milli-amps, up to, for example 70 amps, and back again, in a clock cycle, for example. Furthermore, yet a third challenge is to accomplish this using a circuit that has relatively high power efficiency and also high density. Therefore, a need exists for a DC-to-DC converter circuit that is at least closer to accomplishing these objectives, or at least one of them, than state-of-the-art circuitry.

SUMMARY

Briefly, in accordance with one embodiment of the invention, a DC-to-DC converter includes: a synchronous rectifier converter. The synchronous rectifier converter includes a buck converter. The transformer of the synchronous rectifier converter employs less than five windings on the secondary.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Figure 1:
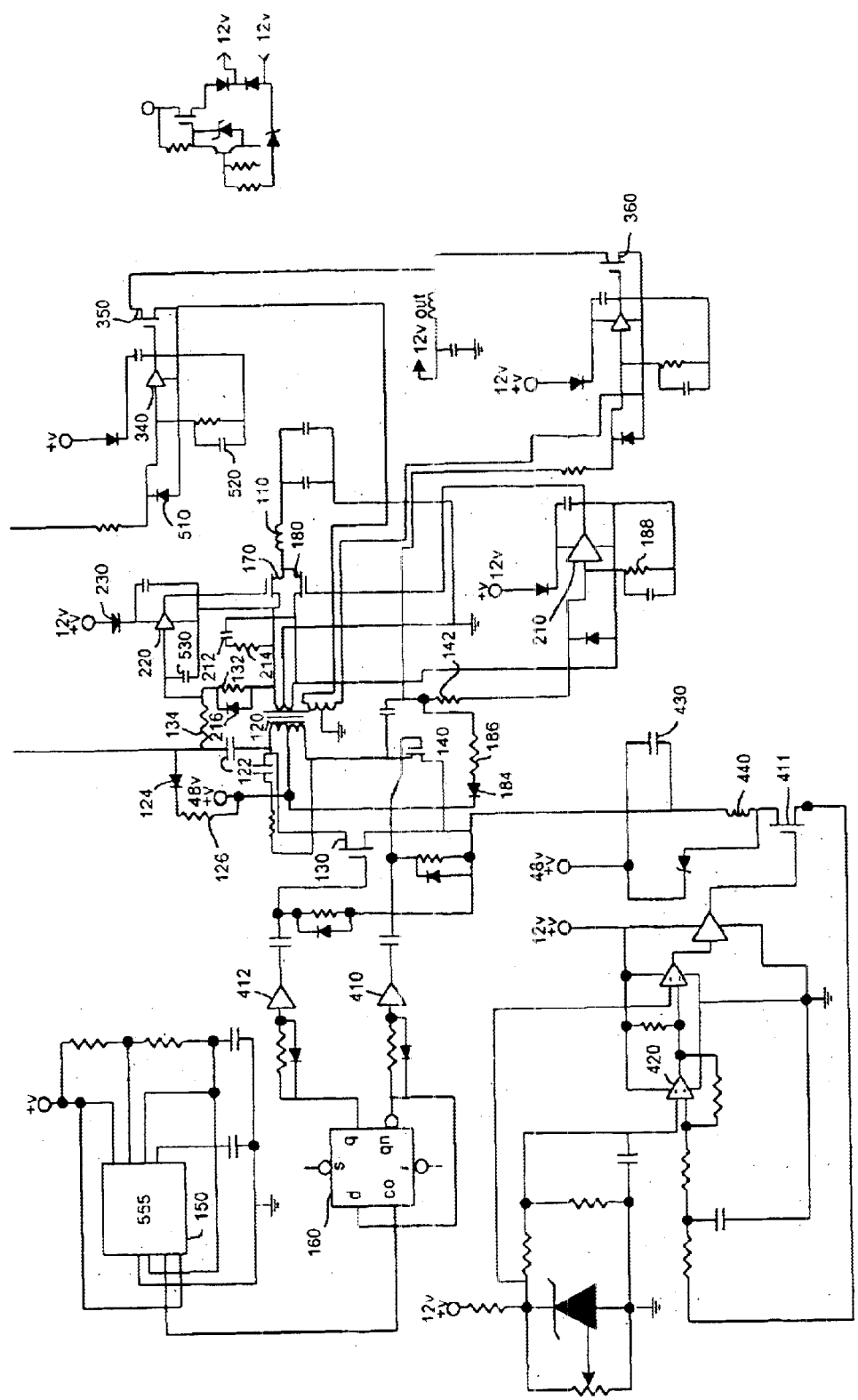
FIG. 1 is a circuit diagram illustrating an embodiment of a DC-to-DC converter in accordance with the present invention.

FIG. 1 is a circuit diagram illustrating an embodiment 100 of a DC-to-DC converter in accordance with the present invention. This particular embodiment comprises a synchronous rectifier converter that shall be described in greater detail hereinafter. The synchronous rectifier converter includes a buck converter, in this particular embodiment on the primary side of the transformer. Of course, the synchronous rectifier converter is not limited in scope to employing a buck converter. Furthermore, some alternative embodiments may not comprise a synchronous rectifier converter. The transformer of the synchronous rectifier converter in this particular embodiment employs less than five windings on the secondary. Throughout this document the term "winding" is intended to mean one complete turn of a transformer coil, unless the context indicates that another meaning is intended. Specifically, in this embodiment, the transformer employs one winding on the secondary, although the invention is not limited in scope in this respect. Likewise, this particular synchronous rectifier converter includes an inductor, such as inductor 110. Like transformer 120, in this particular embodiment, inductor 110 employs less than five windings, here, a single winding, although, again, the invention is not limited in scope in this respect. In this particular embodiment, the synchronous rectifier converter comprises a push/pull synchronous rectifier converter and the buck converter comprises a circuit configuration to step-down the voltage applied to the primary side of the transformer. As shall be explained in more detail hereinafter, by employing this configuration, the synchronous rectifier converter is able to accommodate a load current on the order of tens of amps, while also providing a relatively low voltage. Specifically, this embodiment is capable of accommodating a load current above approximately 60 amps, although, of course, the invention is not limited in scope in this respect.

The primary of transformer 120 is driven by metal-oxide semiconductor field effect transistors (MOSFETs) used to switch the primary to ground with approximately a 50% duty cycle on each MOSFET gate, in particular, MOSFETs 130 and 140 in FIG. 1, although the invention is not limited in scope in this respect. In this particular embodiment, a synchronous rectifier push/pull converter is employed because such converters may accommodate a higher duty cycle than other types of converters, such as a forward converter. An advantage of a high duty cycle is that it provides a greater amount of power, relatively speaking, which may improve the speed of response at the load of the converter. Likewise, such converters are typically relatively efficient, as shall be described in more detail later. In this particular embodiment, the switching signal is produced by a precision 555 timer 150, such as a Texas Instruments' SE555D device, available from Texas Instruments Corp., Dallas, Tex., or equivalent, which may be employed to provide a square wave signal to a, for example, divide by two D-type flip-flop 160. In this particular embodiment, the 555 timer 150 produces a switching signal with approximately a 50% duty cycle which is then applied to a D-type flip-flop, as illustrated. The output signal of this D-type flip-flop (Q and QN) is then applied to MOSFET drivers 410 and 412, such as, for example, the MIC4427 (Micrel) MOSFET drivers, although the invention is not limited in scope in this respect. The output signals of these drivers turn switching MOSFETS 130 and 140 "on" and "off" at an approximate 50% duty cycle. Of course, the invention is not limited in scope to producing a switching signal using this technique. Any one of a large number of techniques and components may be employed.

Although the invention is not limited in scope in this respect, the converter is designed to produce 1.5 volts for the secondary load. The electrical signal induced in the secondary of the transformer is rectified synchronously by MOSFETs in order to reduce losses in the secondary circuit. For example, the resistance across a synchronously rectified transistor is lower than across a diode for approximately the same amount of current and, therefore, reduces power loss. As illustrated for MOSFETs 170 and 180, the gate signal applied is derived from the high-voltage primary side of transformer 120, which has been clamped, divided down and applied to the input port in the MOSFET drivers 220 and 230. Regulation of the 1.5 volt output signal of the synchronous rectifier converter is provided by a buck type converter. The buck converter in this embodiment regulates the source voltage for the primary side MOSFET switches 130 and 140. The high-voltage primary side of transformer 320 is clamped to a +48 volt rail in this embodiment through capacitor 122, diode 124, and resistor 126, is divided down to less than 12V through resistors 132 and 134 with respect to the source of the synchronously rectified MOSFETs 170, and is applied to the MOSFETs driver 120. The gate signal applied to 180 is clamped to +48V through capacitor 182, diode 184, and resistor 186 and is divided down through resistor 142 and resistor 144, again, in this particular embodiment. In this particular embodiment, there are nine MOSFETs on each side of the secondary, and a driver for every nine MOSFETs, although, of course, the invention is not limited in scope in this respect. Likewise, during the negative power portion of the cycle for the secondary circuit, the voltage signal is applied to the driver to fully turn off the MOSFETs when the secondary circuit is on this portion of its cycle. As illustrated in FIG. 1, a 12 volt power source is applied to the driver through a diode 230 and bypass capacitor 240. The capacitor may also provide storage when the secondary circuit is on the positive portion of its cycle. As illustrated, the negative side of the capacitor is coupled to the secondary circuit and becomes charged to (12 volts minus the 1.5 volts secondary negative voltage minus the positive diode drop) approximately 12.9 volts, in this particular embodiment.

When the secondary circuit is on the positive portion of its cycle, the corresponding primary side is likewise positive and the positive input signal is applied to the driver. This will result in the driver output signal achieving a voltage level of 12.9 volts above the 1.5 volt secondary output voltage level and turn on the MOSFETs for that side. Conversely, when the secondary circuit is on the negative portion of its cycle, the primary polarity is negative, resulting in the output signal of the driver transitioning low, to 1.5 volts in this particular embodiment, and turning off the MOSFETs. As illustrated, in this particular embodiment, the output voltage of the synchronous rectifier circuit is sensed by the buck converter, and will turn on the buck converter switching MOSFETs if the voltage level is too low, and turn them off if the voltage is too high. Hysteresis is provided via buck comparator 420 to provide two discrete switching levels for stability. As this voltage applied to the primary MOSFET source(s) increases, there is less voltage across the transformer primary, and so the output voltage decreases. Conversely, as the source voltage decreases, there is a greater voltage across the transformer primary, and the output voltage increases.

As shown FIG. 1, another secondary winding 320 is employed to provide 12 volts for control of this particular embodiment. Associated with this winding are drivers 330 and 340 and MOSFETs 350 and 360. This particular circuit also employs synchronous rectification and operates in a fashion analogous to the 1.5 volt secondary circuit. This particular circuit helps ensure that the transistors on both sides of the secondary winding are not "on" at the same time through capacitor 212, resistor 214, and diode 210 and capacitor 530, diode 510 and capacitor 520. Although the invention is not limited in scope in this respect, as illustrated, a "bootstrap" 12 volt source is employed which comprises a zener voltage regulator driving the gate of a 20N06 MOSFET, such as, for example, a Motorola MTD20N06HDL MOSFET, available from Motorola Corp., Schaumberg, Ill., which provides approximately 12 volts into a dual diode, which supplies 12 volts to the control circuitry. When the 12 volt section of the converter produces above 10 volts, the boot strap circuit is then shut off.

As previously indicated, in this particular embodiment, regulation of the converter is provided by a buck type converter, although the invention is not limited in scope in this respect. For example, although the invention is not limited in scope in this respect, a ripple IC controller, such as, for example, the Texas Instruments' SN104685DW controller, available from Texas Instruments Corp., Dallas, Tex., may be employed. As previously indicated, the buck converter regulates the source voltage for the primary side MOSFET switches. The output voltage is sensed by the buck converter and will, therefore, turn on the buck switch MOSFET 411, if the voltage level is too low and turn it off if the voltage level is too high. Likewise, hysteresis is provided to the buck comparator to provide two discrete switching levels, for stability, as illustrated by comparator 420 and the circuit configuration coupled to its negative input port. Of course, the invention is not limited in scope to this particular circuit configuration.

Figure 2:
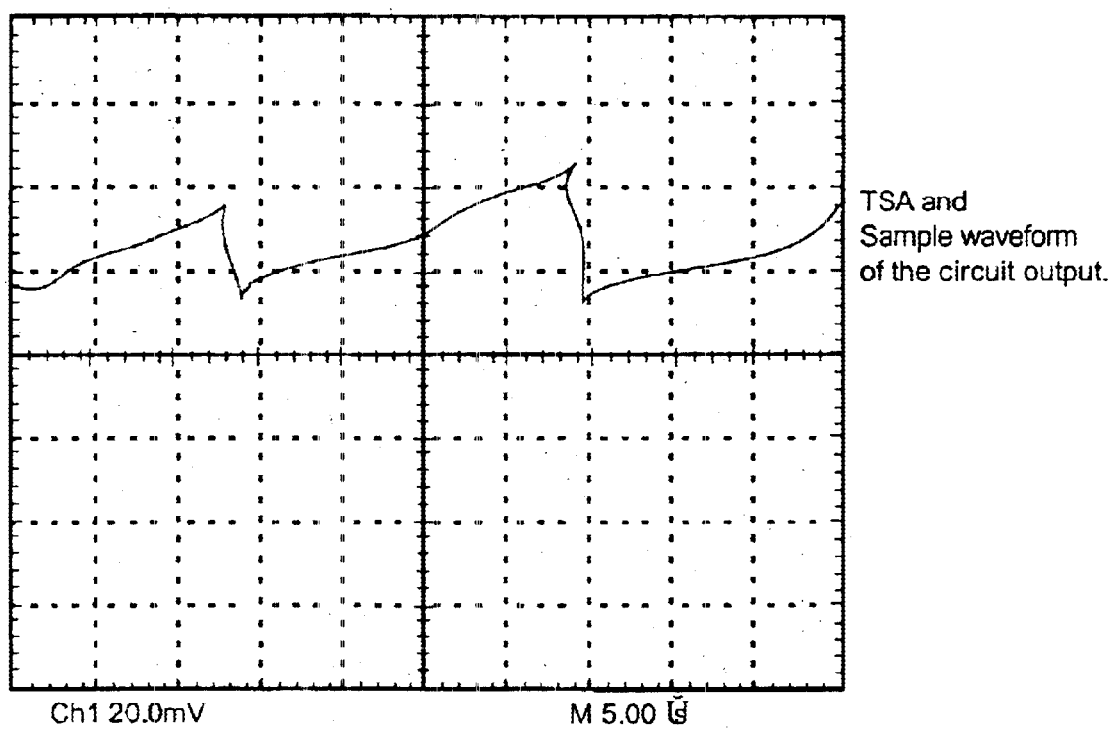
FIGS. 2 and 3 are plots of voltage signals produced by the circuit of FIG. 1.
Figure 3:
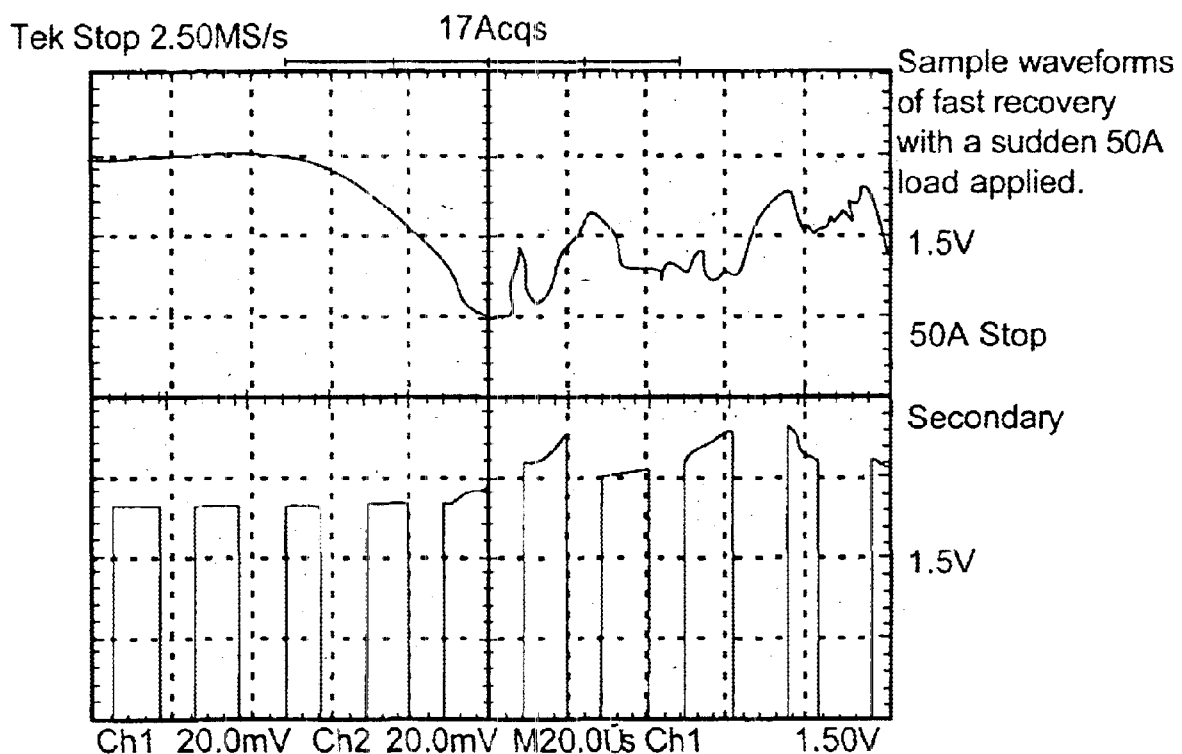
Figure 4:
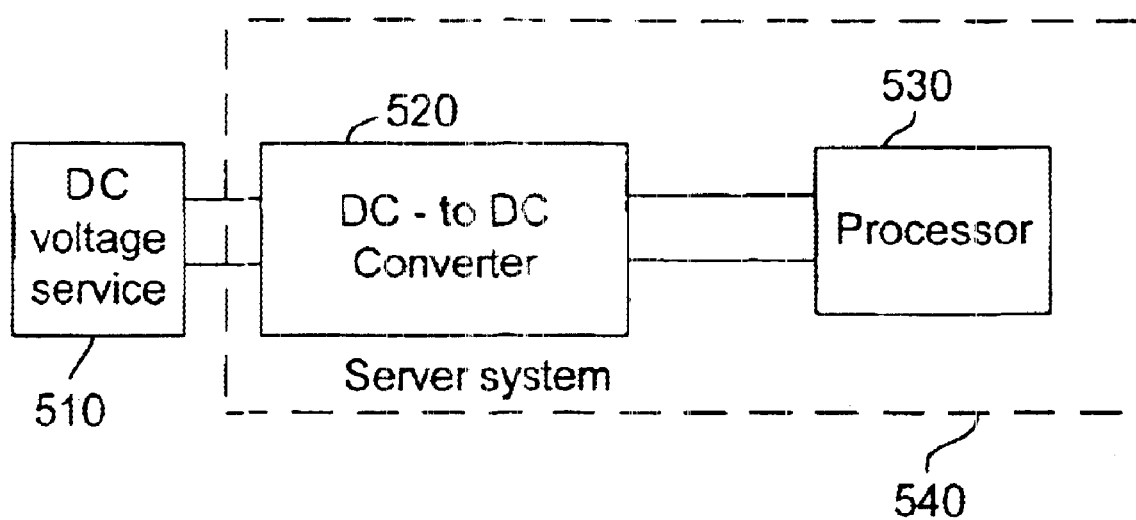
FIG. 4 is a schematic diagram illustrating another embodiment in accordance with the present invention.

As previously indicated, the synchronous rectifier converter feedback operates as follows: as the voltage applied to the primary MOSFET source(s) increases, there is less voltage across the transformer primary and so the output voltage decreases. Conversely, as the source voltage decreases, there is a greater voltage across the transformer primary, and the output voltage increases. Therefore, as illustrated in FIG. 2, a typical ripple waveform is produced to be smoothed. In this embodiment, the 12 volt output signal is not separately regulated since small variations in its voltage will not affect operation significantly. As FIG. 3 illustrates, this particular embodiment has a relatively fast response time to maintain the output voltage within about 20 milli-volts with a positive offset of 20 milli-volts. In this embodiment, a 20 milli-volts offset is employed under no load condition so that when a 50 amp step load occurs, the output voltage will not drop below lower regulation limit of (1.5V+/−1%) for this embodiment, and will have a droop of typically no greater than about 40 milli-volts with a 50 amp load step, although the invention is not limited in scope in this respect.

An aspect of the fast response relates to a small output capacitor 430 employed with the buck converter. This, however, may result in difficulties with recovery when the load is removed.

The flux energy stored in inductor 440 may flow into the small value output capacitor and raise its voltage beyond specifications. In some embodiments, it may alternately be desirable to reduce the inductor value and increase the output capacitance or, alternatively, employ a form of transient suppression.

Embodiments of a DC-to-DC converter in accordance with the present invention provide several advantages. Due, at least in part, to the reduced number of windings, as previously described, the resistance of the forward path of the secondary circuit is relatively low. This provides the capability for the converter to accommodate a relatively large load current and a relatively small load voltage. If the resistance of the forward path were large, then a large step in current might result in the load voltage dropping to an unacceptably low level. In addition, this improves the efficiency of the converter, since less power is dissipated. Of course, one possible disadvantage is that the circuitry may be more complex to smooth the ripple waveform produced by the reduced number of windings. The efficiency is also improved, as previously indicated, through the use of a synchronous rectifier in this particular embodiment. Likewise, as previously explained, this may also result in a higher duty cycle and associated faster response. A buck converter is employed in this particular embodiment to step down the voltage on the primary side of the transformer. This is desirable in this particular embodiment because the ratio of the input voltage to output voltage might otherwise produce an unacceptably short duty cycle. It will, of course, be appreciated that the invention is not limited to all the features described in this particular embodiment and many other embodiments with more features or less features are possible and desirable, depending on the particular situation.

An embodiment of a method of producing a high current, low voltage, direct current output or load signal in accordance with the present invention, such as in a DC-to-DC converter, for example, may be as follows. A switching power signal, such as a square, for example, as described in the embodiment of FIG. 1, for example, may be applied to the primary of a transformer having a single winding on its secondary, for example, as previously described. Of course, the invention is not limited in scope to this embodiment, such as a square wave or to a single winding. The power signal induced in the secondary of the transformer is synchronously rectified, and the synchronously rectified power signal is smoothed using an output circuit that has an output inductor with a single winding, again, in this particular embodiment. The duty cycle of the switching power signal applied to the primary is adjusted, at least in part, based on the voltage of the smoothed, synchronously rectified, induced secondary power signal. In one embodiment, as previously described, the duty cycle is adjusted using a buck converter. Furthermore, in one embodiment, the primary voltage of the transformer is stepped down before application to the buck converter, as described, for example, in the embodiment of FIG. 1.

While certain features of the invention have been illustrated as described herein, many modifications, substitutions, changes, and equivalents thereof will now occur to those skill in art. For example, a DC-to-DC converter in accordance with the present invention, in one embodiment, without limitation, may be coupled to a processor, such as a microprocessor, for example. Also, this may be incorporated into a system, such, for example, without limitation, a server system. It is, therefore, to be understood that the appended claims are intended to cover all such modifications and changes as fall within the true spirit of the invention.

What is claimed is:

1. A DC-to-DC converter comprising:
a synchronous rectifier converter, said synchronous rectifier converter comprising a transformer and a ripple IC controller, wherein the synchronous rectifier includes an output inductor, the inductor employing less than five windings, wherein the synchronous rectifier comprises a push-pull synchronous rectifier, wherein the ripple IC controller comprises a circuit configuration to step down the voltage applied to the primary of the transformer, wherein the primary of said transformer is driven by a plurality of metal-oxide semiconductor field effect transistors (MOSFETs);
the transformer of said synchronous rectifier converter employing less than five windings on the secondary of the transformer, wherein the secondary of the transformer is configured such that the electrical signals induced in the secondary are rectified synchronously by a plurality of MOSFETs.

2. A system comprising:
a processor and a DC-to-DC converter;
the DC-to-DC converter capable of providing a load current above approximately 60 amps and a load voltage of approximately 1.5 volts to said processor, wherein said DC-to-DC converter includes a transformer, the transformer of said DC-to-DC converter employing one winding on the secondary of the transformer, the transformer configured such that the primary of the transformer is driven by metal-oxide semiconductor field effect transistors (MOSFETs), wherein said DC-to-DC converter includes an output inductor, the output inductor employing one winding, wherein the processor comprises a microprocessor, wherein the DC-to-DC converter includes a ripple IC controller, wherein the microprocessor and DC-to-DC converter are incorporated into a server system.

3. A method of producing a high current, low voltage direct current output signal comprising:
applying a switching power signal to the primary of a transformer having a single winding on its secondary;
synchronously rectifying the power signal induced in the secondary of the transformer; and
smoothing the synchronously rectified signal using an output inductor having a single winding;
adjusting the duty cycle of the switching power signal applied to the primary based, at least in part, on the voltage of the smoothed, synchronously rectified induced secondary power signal, wherein the duty cycle is adjusted using a ripple IC controller; and
stepping down the primary voltage before application to the ripple IC controller.

* * * * *